United States Patent
Heuel et al.

(10) Patent No.: US 11,630,141 B2
(45) Date of Patent: *Apr. 18, 2023

(54) VECTOR NETWORK ANALYZER WITH DIGITAL INTERFACE

(71) Applicant: Rohde & Schwarz GmbH & Co. KG, Munich (DE)

(72) Inventors: Steffen Heuel, Lennestadt (DE); Steffen Neidhardt, Dorfen (DE); Thilo Bednorz, Erding (DE)

(73) Assignee: Rohde & Schwarz GmbH & Co. KG, Munich (DE)

( * ) Notice: Subject to any disclaimer, the term of this patent is extended or adjusted under 35 U.S.C. 154(b) by 0 days.

This patent is subject to a terminal disclaimer.

(21) Appl. No.: 17/205,740

(22) Filed: Mar. 18, 2021

(65) Prior Publication Data

US 2021/0223301 A1 Jul. 22, 2021

Related U.S. Application Data

(63) Continuation of application No. 15/898,874, filed on Feb. 19, 2018, now Pat. No. 11,041,894.

(Continued)

(51) Int. Cl.
*G01R 27/28* (2006.01)
*G01R 27/32* (2006.01)

(52) U.S. Cl.
CPC ............. *G01R 27/28* (2013.01); *G01R 27/32* (2013.01)

(58) Field of Classification Search
CPC ................................ G01R 27/32; G01R 27/28
See application file for complete search history.

(56) References Cited

U.S. PATENT DOCUMENTS 6,411,252 B1 * 6/2002 Grace .................. H01Q 1/3233
342/174
6,864,699 B2 3/2005 Sakayori et al.
(Continued)

FOREIGN PATENT DOCUMENTS

CN 102545935 A * 7/2012
CN 103605024 A 2/2014
(Continued)

OTHER PUBLICATIONS

Cruz, et al., "Mixed Analog-Digital Instrumentation for Software-Defined-Radio Characterization", 2008 IEEE MTT-S International Microwave Symposium Digest, 2008, pp. 253-256, doi: 10.1109/MWSYM.2008.4633151, 2008.

(Continued)

*Primary Examiner* — Patrick Assouad
*Assistant Examiner* — Demetrius R Pretlow
(74) *Attorney, Agent, or Firm* — Potomac Technology Law, LLC

(57) ABSTRACT

A vector network analyzer is provided which includes a first measuring port, a digital interface connected to the first measuring port, a second measuring port adapted to be connected to a radio frequency (RF) input or output of a device under test (DUT), and a processor. The digital interface is adapted to be connected to a digital input or output of the DUT. The processor is adapted to determine scattering parameters (S-parameters) of the DUT based on measuring signals transmitted to the DUT and received from the DUT by the first measuring port and the second measuring port.

14 Claims, 8 Drawing Sheets

Related U.S. Application Data

(60) Provisional application No. 62/547,195, filed on Aug. 18, 2017.

(56) References Cited

U.S. PATENT DOCUMENTS

| | | | |
|---|---|---|---|
| 7,088,109 B2 * | 8/2006 | Tanbakuchi | G01R 27/28 324/622 |
| 7,359,814 B1 | 4/2008 | Nakayama et al. | |
| 7,831,222 B1 | 11/2010 | Mullinax et al. | |
| 8,508,237 B2 | 8/2013 | Maestle | |
| 10,225,073 B1 | 3/2019 | Martens et al. | |
| 10,365,345 B1 * | 7/2019 | Bradley | H04B 1/40 |
| 2002/0053898 A1 | 5/2002 | Ademian et al. | |
| 2004/0066857 A1 | 4/2004 | Srinivasan et al. | |
| 2004/0193382 A1 * | 9/2004 | Adamian | B82Y 30/00 702/118 |
| 2006/0066289 A1 * | 3/2006 | Tanbakuchi | G01R 27/28 324/76.19 |
| 2006/0148472 A1 * | 7/2006 | Bradley | H03K 7/08 455/434 |
| 2007/0236230 A1 * | 10/2007 | Tanbakuchi | G01R 31/2841 324/650 |
| 2008/0020726 A1 | 1/2008 | Blackham et al. | |
| 2008/0317171 A1 | 12/2008 | Jungerman | |
| 2009/0216468 A1 * | 8/2009 | Anderson | G01R 23/165 702/57 |
| 2010/0082023 A1 | 4/2010 | Brannan et al. | |
| 2010/0102829 A1 * | 4/2010 | Azarian | G01R 27/08 324/651 |
| 2011/0163762 A1 | 7/2011 | Marchetti et al. | |
| 2011/0241712 A1 | 10/2011 | Zelder et al. | |
| 2011/0288820 A1 | 11/2011 | Bednorz et al. | |
| 2015/0071097 A1 * | 3/2015 | Entsfellner | G01R 35/005 370/252 |
| 2015/0177300 A1 | 6/2015 | Paech et al. | |
| 2015/0180416 A1 | 6/2015 | Fernandez | |
| 2016/0033563 A1 | 2/2016 | Needham et al. | |
| 2016/0099784 A1 | 4/2016 | Bratfisch et al. | |
| 2016/0113013 A1 | 4/2016 | Dark et al. | |
| 2017/0016953 A1 | 1/2017 | Beer | |
| 2017/0019170 A1 | 1/2017 | Lee | |
| 2017/0111127 A1 | 4/2017 | Vanwiggeren et al. | |
| 2018/0109330 A1 | 4/2018 | Chang | |
| 2018/0203050 A1 | 7/2018 | Winston et al. | |
| 2018/0252791 A1 | 9/2018 | Leibfritz et al. | |
| 2018/0302205 A1 | 10/2018 | Leibfritz et al. | |
| 2019/0072594 A1 | 3/2019 | Leibfritz et al. | |
| 2019/0072598 A1 * | 3/2019 | Leibfritz | G01R 31/2824 |
| 2019/0219480 A1 * | 7/2019 | Jalali | G01M 11/3118 |

FOREIGN PATENT DOCUMENTS

| | | | | |
|---|---|---|---|---|
| CN | 103618569 A | * | 3/2014 | |
| CN | 104849585 A | | 8/2015 | |
| CN | 106788792 A | * | 5/2017 | |
| CN | 206161743 U | * | 5/2017 | |
| DE | 19957327 B4 | * | 2/2005 | G01R 27/28 |
| DE | 102006035827 A1 | * | 9/2007 | G01R 27/32 |
| DE | 102015214289 B3 | | 9/2016 | |
| EP | 0418509 A2 | | 3/1991 | |
| EP | 1181562 A2 | | 8/2000 | |
| WO | 2017017579 A1 | | 2/2017 | |

OTHER PUBLICATIONS

EPO, "Article 94(3) Communication (Office Action)", EPO Application No. 18162710.0, dated Apr. 13, 2021.

Ribeiro, et al., "Synchronous Oversampled Measurements for the Extraction of Mixed-Signal Behavioral Models in Digital to Analog Integrated Transmitters", IEEE Transactions on Microwave Theory and Techniques, vol. 62, No. 12, pp. 3183-3192, Dec. 2014.

Schindler, et al., "Monolithic GaAs Electro-Optic IQ Modulator", Journal of Lightwave Technology, vol. 32, No. 4, Feb. 15, 2014, 760-765.

National Instruments, "Efficient Testing of Wireless Radio Equipment Including RF and CPRI", http://www.ni.com/white-paper/5305/en, Mar. 15, 2017.

Rohde & Schwarz, "Test your remote radio head solutions", https://www.rohde-schwarz.com/us/applications/test-your-remote-radio-head-solutions-application-card_56279-4672.html, May 12, 2017.

* cited by examiner

VECTOR NETWORK ANALYZER WITH DIGITAL INTERFACE

RELATED APPLICATIONS

This application is a continuation and claims the benefit of the earlier filing date under 35 U.S.C. § 120 from U.S. application Ser. No. 15/898,874 (filed 2018 Feb. 19), which claims the benefit of the earlier filing date under 35 U.S.C. § 119(e) from U.S. Provisional Application Ser. No. 62/547,195 (filed 2017 Aug. 18), the entireties of which are incorporated by reference herein.

TECHNICAL FIELD

The invention relates to a network vector analyzer, and a measuring method using a measuring device (such as vector network analyzer), which allow the measurement of scattering parameters (in the following S-parameters) of devices under test. The measuring device may also have an optical input or output.

BACKGROUND

A regular vector network analyzer has at least two analog measuring ports. A device under test is supplied with an analog input signal and reacts by generating an analog output signal. The input signal is provided by a measuring port of the network analyzer, while the analog output signal is measured by a further measuring port of the vector network analyzer. By comparing the input signal and the output signal, the S-parameters of the device under test are determined.

In recent years, more and more devices under test with only a single analog port, be it an input or an output, have come into existence. For example, a remote radio head of a base-station comprises an optical input and an analog radio frequency output. It is therefore not possible to determine the S-parameters of such a device with a conventional vector network analyzer.

For example, the U.S. Pat. No. 8,508,237B2 shows a conventional vector network analyzer having only analog radio frequency ports. There, a calibration device is shown, which encompasses an interface from electrical signals to optical signals and also an optical calibration standard.

Accordingly, there is a need for a vector network analyzer that can perform S-parameter measurements on devices under test having digital or optical ports.

Some Example Embodiments

Embodiments of the present invention advantageously address the foregoing requirements and needs, as well as others, by providing a measuring device (such as a vector network analyzer), and a measuring method using a measuring device (such as a vector network analyzer), which can perform S-parameter measurements on devices under test having digital or optical ports.

According to a first aspect of the invention, a measuring device (such as a vector network analyzer) is provided. The vector network analyzer comprises a first measuring port, a first digital interface, connected to the first measuring port, adapted to be connected to a digital input or output of a device under test, a second measuring port adapted to be connected to a radio frequency input or output of the device under test, a processor adapted to determine S-parameters of the device under test based on measuring signals transmitted to the device under test and received from the device under test, by the first measuring port and the second measuring port. It is thereby possible to determine the S-parameters of the device under test while using only a single radio frequency port of the device under test.

According to a first implementation form of the first aspect, wherein the first digital interface is connected to a digital input of the device under test, and the second measuring port is connected to a radio frequency output of the device under test, the first measuring port is adapted to generate a first analog measuring signal and supply it to the first digital interface, the first digital interface is adapted to generate a first digital measuring signal from the first analog measuring signal, the first digital interface is adapted to provide the first digital measuring signal to the digital input of the device under test, the second measuring port is adapted to receive a second analog measuring signal from the device under test, which the device under test generates based on the first digital measuring signal, and the processor is adapted to determine the S-parameters of the device under test from the first analog measuring signal and the second analog measuring signal. It is thereby possible to accurately determine S-parameters for the case of a digital input of the device under test.

According to a second implementation form of the first aspect, wherein the first digital interface is connected to a digital output of the device under test and the second measuring port is connected to a radio frequency input of the device under test, the second measuring port is adapted to generate a third analog measuring signal and supply to the radio frequency input of the device under test, the first digital interface is adapted to receive a second digital measuring signal, which the device under test generates based on the third analog measuring signal, the first digital interface is adapted to generate a fourth analog measuring signal based on the second digital measuring signal, and the processor is adapted to determine the S-parameters of the device under test from the third analog measuring signal and the fourth analog measuring signal. Also for the case of a digital output of the device under test, it is possible to accurately determine the S-parameters.

According to a third implementation form of the first aspect, the measuring device further comprises a first measuring port connector adapted to connect the radio frequency input or output of the device under test to the first measuring port, a first digital interface connector adapted to connect the digital input or output of a device under test to the first digital interface, and a coupler adapted to connect the measuring port to first measuring port connector and to the first digital interface connector. It is thereby possible to selectively have a connection between the first measuring port and the digital interface or the connector.

According to a fourth implementation form of the first aspect, the measuring device further comprises a third measuring port and a first optical interface connected to the third measuring port adapted to be connected to an optical input or output of a device under test. The processor is then adapted to determine the S-parameters of the device under test based on measuring results transmitted to the device under test and received from the device under test by the first measuring port and/or the second measuring port and/or the third measuring port. It is thereby possible to additionally handle optical signals, which significantly increase the flexibility of the measuring device.

According to a fifth implementation form of the first aspect, wherein the first optical interface is connected to an optical input of the device under test and the second measuring port is connected to a radio frequency output of the device under test, the third measuring port is adapted to generate a fifth analog measuring signal and supply it to the first optical interface, the first optical interface is adapted to generated a first optical measuring signal from the fifth analog measuring signal, the first optical interface is adapted to provide the first optical measuring signal to the optical input of the device under test, the second measuring port is adapted to receive a sixth analog measuring signal from the device under test, which the device under test generates based on the first optical measuring signal, and the processor is adapted to determine the S-parameters of the device under test from the fifth analog measuring signal and the sixth analog measuring signal. This approach allows for receiving optical signals by the device under test and the determining S-parameters therefrom. This increases the flexibility of the measuring device.

According to a sixth implementation form of the first aspect, wherein the first optical interface is connected to an optical output of the device under test and the second measuring port is connected to a radio frequency input of the device under test, the second measuring port is adapted to generate a seventh analog measuring signal and supply it to the radio frequency input of the device under test, the first optical interface is adapted to receive a second optical measuring signal, which the device under test generates based on the seventh analog measuring signal, the first optical interface is adapted to generate an eighth analog measuring signal based on the second optical measuring signal, and the processor is adapted to determine the S-parameters of the device under test from the seventh analog measuring signal and the eighth analog measuring signal. It is thereby possible to also handle receiving optical signals from the device under test. This furthermore increases the flexibility of the measuring device.

According to a seventh implementation form of the first aspect, the measuring device further comprises a second measuring port connector adapted to connect the radio frequency input or output of the device under test to the third measuring port, a first optical interface connector adapted to connect the digital input or output of the device under test to the first optical interface, and a further coupler adapted to connect the third measuring port to the second measuring port connector and to the first optical interface connector. It is thereby possible to selectively have a connection between the third measuring port and the optical interface or the respective measuring port connector directly.

According to an eighth implementation form of the first aspect, the vector network analyzer additionally comprises a fourth measuring port adapted to be connected to a further radio frequency input or output of the device under test, a fifth measuring port, and a second digital interface, connected to the fifth measuring port, adapted to be connected to a further digital input or output of the device under test. The processor is then adapted to determine S-parameters of the device under test based on measuring signal transmitted to the device under test and received from the device under test by the first measuring port, the second measuring port, and the fourth measuring port. By having two digital interfaces, two digital signals transmitted by or received from the device under test can be handled while determining the S-parameters. This significantly increases the flexibility of the measuring device.

According to a ninth implementation form of the first aspect, wherein the first digital interface is connected to a digital Inphase-parameter (in the following I-parameter) input of the device under test, the second digital interface is connected to a digital quadrature phase parameter (in the following Q-parameter) input of the device under test, the fourth measuring port is connected to a local oscillator input of the device under test, and the second measuring port is connected to a radio frequency output of the device under test, the first measuring port is adapted to generate a first analog I-parameter signal and provide it to the first digital interface, the first digital interface is adapted to generate a first digital I-parameter signal and provide it to the digital I-parameter input of the device under test, the fifth measuring port is adapted to generate a first analog Q-parameter signal and provide it to the second digital interface, the second digital interface is adapted to generate a first digital Q-parameter signal and provide it to the digital Q-parameter input of the device under test, the fourth measuring port is adapted to generate a local oscillator signal and provide it to the local oscillator input of the device under test, the second measuring port is adapted to receive a ninth analog measuring signal and the processor is adapted to determine the S-parameters of the device undertest from the first analog I-parameter signal, the first analog Q-parameter signal, the local oscillator signal and the ninth analog measuring signal. It is thereby possible to measure on devices having a digital I/Q-interface as an input.

In a tenth implementation form of the first aspect, wherein the first digital interface is connected to a digital I-parameter output of the device under test, the second digital interface is connected to a digital Q-parameter output of the device under test, the fourth measuring port is connected to a local oscillator input of the device under test, and the second measuring port is connected to a radio frequency input of the device under test, the fourth measuring port is adapted to generate a local oscillator signal and provide it to the local oscillator input of the device under test, the second measuring port is adapted to generate a tenth analog measuring signal and provide it to the radio frequency input of the device under test, the first digital interface is adapted to receive a second digital I-parameter signal and generate a second analog I-parameter signal therefrom, the second digital interface is adapted to receive a second digital Q-parameter signal and generate a second analog Q-parameter signal therefrom, the first measuring port is adapted to receive the second analog I-parameter signal, the fifth measuring port is adapted to receive the second analog Q-parameter signal, and the processor is adapted to determine the S-parameters of the device under test from the second analog I-parameter signal, the second Q-parameter signal, the local oscillators signal and the tenth analog measuring signal. Thereby it is possible to process devices under test having a digital I/Q-output interface. This significantly increases the flexibility of the measuring device.

According to a second aspect of the invention, a method for measuring the scattering parameters of a device under test is provided. The method comprises connecting a device under test to a digital interface of a vector network analyzer, connecting the device under test to a measuring port of the vector network analyzer, supplying a digital measuring signal, generated from a first analog measuring signal, to the device under test via the digital interface, measuring a second analog measuring signal, generated by the device under test as a reaction to the digital measuring signal, via the measuring port of the vector network analyzer, and determining scattering parameters of the device under test from the first analog measuring signal and the second analog measuring signal. This allows for determining the scattering parameters of a device under test having a digital input port.

According to a third aspect of the invention, a method for measuring the scattering parameters of a device under test is provided. The method comprises connecting a device under test to a digital interface of a vector network analyzer, connecting the device under test to a second measuring port of the vector network analyzer, supplying a first analog measuring signal to the device under test via the second measuring port, receiving a digital measuring signal via the first digital interface and generating a second analog measuring signal therefrom, measuring the second analog measuring signal via the first measuring port, and determining S-parameters of the device under test from the second analog measuring signal and the first analog measuring signal. This allows for determining the scattering parameters of a device under test having a digital output. This significantly increases the flexibility of the measuring method.

According to a fourth aspect of the invention, a method for measuring the scattering parameters of a device under test is provided. The method comprises connecting a device under test to a first digital interface of a vector network analyzer, connecting the device under test to a second digital interface of the vector network analyzer, connecting the device under test to a first measuring port of the vector network analyzer, connecting the device under test to a second measuring port of the vector network analyzer, generating a first analog Inphase-parameter signal via a third measuring port, providing a digital I-parameter signal, generated from the analog I-parameter signal, to the device under test via the first digital interface, generating an analog quadrature phase parameter signal via a fourth measuring port, providing a digital Q-parameter signal, generated from the analog Q-parameter signal, to the device under test via the second digital interface, providing a local oscillator signal to the device under test via the fourth measuring port, measuring an analog measuring signal via the second measuring port, and determining scattering parameters of the device under test from the analog measuring signal, the local oscillator signal, and the analog I-parameter signal and the first analog Q-parameter signal. This allows for measuring the S-parameters of a device under test having a digital I/Q-parameter input. This significantly increases the flexibility of use of the method.

According to a fifth aspect of the invention, a method for measuring the scattering parameters of a device under test is provided. The method comprises connecting a device under test to a first digital interface of a vector network analyzer, connecting the device under test to a second digital interface of the vector network analyzer, connecting the device under test to a first measuring port of the vector network analyzer, connecting the device under test to a second measuring port of the network vector analyzer, providing a local oscillator signal to the device under test via the second measuring port, providing an analog measuring signal to the device under test via the first measuring port, receiving a digital Inphase (I)-parameter signal and determining an analog I-parameter signal therefrom, receiving a digital quadrature phase (Q)-parameter signal and determining an analog Q-parameter signal therefrom, and determining the scattering parameters of the device under test from the second analog I-parameter signal, the analog Q-parameter signal, the local oscillator signal, and the analog measuring signal. This allows for performing measurements on a device under test having a digital I/Q-parameter output. This significantly increases the flexibility of the method.

Still other aspects, features, and advantages of the present invention are readily apparent from the following detailed description, simply by illustrating a number of particular embodiments and implementations, including the best mode contemplated for carrying out the present invention. The present invention is also capable of other and different embodiments, and its several details can be modified in various obvious respects, all without departing from the spirit and scope of the present invention. Accordingly, the drawing and description are to be regarded as illustrative in nature, and not as restrictive.

BRIEF DESCRIPTION OF THE DRAWINGS

Embodiments of the present invention are illustrated by way of example, and not by way of limitation, in the figures of the accompanying drawings, in which like reference numerals refer to similar elements, and in which.

DETAILED DESCRIPTION

Figure 1:
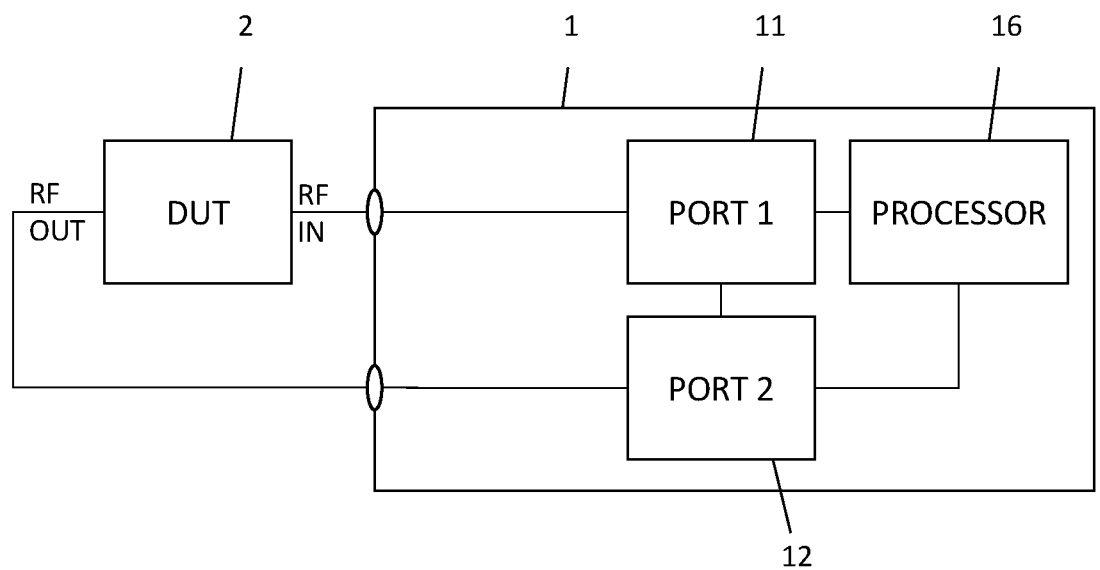
FIG. 1 shows a vector network analyzer according to the prior art.

Approaches for a measuring device (such as a vector network analyzer), and measuring methods using a measuring device (such as a vector network analyzer), which can perform S-parameter measurements on devices under test having digital or optical ports, are described. It is apparent, however, that the invention may be practiced without these specific details or with an equivalent arrangement. In other instances, well-known structures and devices are shown in block diagram form in order to avoid unnecessarily obscuring the invention.

As will be appreciated, a module or component (as referred to herein) may be composed of software component(s), which are stored in a memory or other computer-readable storage medium, and executed by one or more processors or CPUs of the respective devices. As will also be appreciated, however, a module may alternatively be composed of hardware component(s) or firmware component(s), or a combination of hardware, firmware and/or software components. Further, with respect to the various example embodiments described herein, while certain of the functions are described as being performed by certain components or modules (or combinations thereof), such descriptions are provided as examples and are thus not intended to be limiting. Accordingly, any such functions may be envisioned as being performed by other components or modules (or combinations thereof), without departing from the spirit and general scope of the present invention. Moreover, the methods, processes and approaches described herein may be processor-implemented using processing circuitry that may comprise one or more microprocessors, application specific integrated circuits (ASICs), field programmable gate arrays (FPGAs), or other devices operable to be configured or programmed to implement the systems and/or methods described herein. For implementation on such devices that are operable to execute software instructions, the flow diagrams and methods described herein may be implemented in processor instructions stored in a computer-readable medium, such as executable software stored in a computer memory store.

Further, terminology referring to computer-readable media or computer media or the like as used herein refers to any medium that participates in providing instructions to the processor of a computer or processor module or component for execution. Such a medium may take many forms, including but not limited to non-transitory non-volatile media and volatile media. Non-volatile media include, for example, optical disk media, magnetic disk media or electrical disk media (e.g., solid state disk or SDD). Volatile media include dynamic memory, such random access memory or RAM. Common forms of computer-readable media include, for example, floppy or flexible disk, hard disk, magnetic tape, any other magnetic medium, CD ROM, CDRW, DVD, any other optical medium, random access memory (RAM), programmable read only memory (PROM), erasable PROM, flash EPROM, any other memory chip or cartridge, or any other medium from which a computer can read data.

First, the problems of a prior art vector network analyzer are addressed with reference to FIG. 1. Then, with reference to FIG. 2-FIG. 7, different embodiments of a vector network analyzer, which can perform S-parameter measurements on device(s) under test having digital or optical ports, in accordance with example embodiments of the present invention, are described in detail with regard to their construction and function. Finally, with reference to FIG. 8-FIG. 10, different embodiments of measuring methods for measuring the scattering parameters of a device under test, in accordance with example embodiments of the present invention, are described. Similar entities and reference numbers in different figures have been partially omitted.

Reference will now be made in detail to example embodiments of the present invention, examples of which are illustrated in the accompanying drawings. However, the following embodiments of the present invention may be variously modified and the range of the present invention is not limited by the following embodiments. Further, in the following description, the term measuring port is used in the sense of an entire measuring path, including the entire signal processing with regard to a single signal (not only the connector of the vector network analyzer is meant).

FIG. 1 shows a regular vector network analyzer 1 according to the prior art. The network vector analyzer 1 comprises a first measuring port 11, a second measuring port 12 and a processor 16, connected to the first measuring port 11 and the second measuring port 12.

A device under test 2 is connected to the first measuring port 11 and the second measuring port 12. The first measuring port 11 provides a radio frequency signal to the device under test 2, which generates a radio frequency output signal as a response. The signal is measured by the second measuring port 12. From the signal generated by the first measuring port 11 and the signal received by the second measuring port 12, the processor 16 determines the scattering parameters (S-parameters) of the device under test 2.

Figure 2:
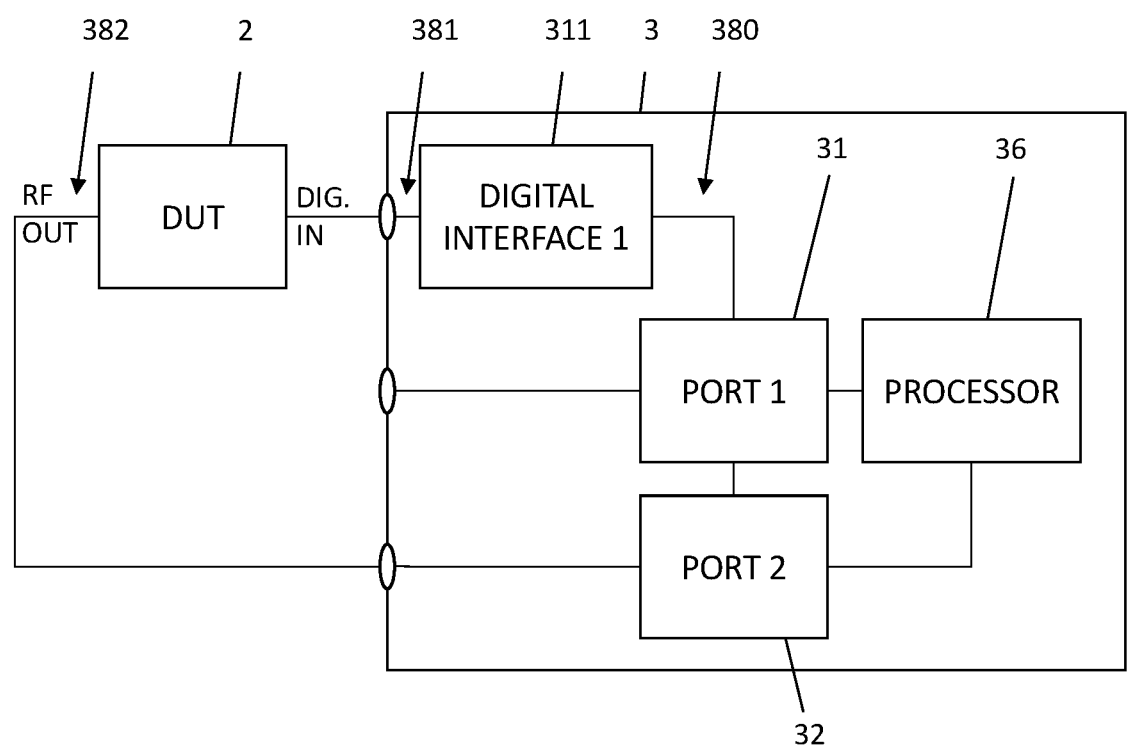
FIG. 2 shows a first embodiment of a vector network analyzer adapted to perform S-parameter measurements on device(s) under test, in accordance with example embodiments of the present invention.

FIG. 2 shows a first embodiment of a vector network analyzer 3 adapted to perform S-parameter measurements on device(s) under test, in accordance with example embodiments of the present invention. The vector network analyzer 3 here comprises a first measuring port 31 and a second measuring port 32. The first measuring port 31 is additionally connected to a digital interface 311, which in turn is connected to a digital input of the device under test 2. The device under test 2 is connected to the second measuring port 32 with its radio frequency output. When performing a measurement, the first measuring port 31 generates a first analog measuring signal 380 and supplies it to the digital interface 311. The digital interface 311 therefrom generates a first digital measuring signal 381 and supplies it to the digital input of the device under test 2. The device under test 2 therefrom generates a second analog measuring signal 382, which is measured by the second measuring port 32. From the first analog measuring signal 380 and the second analog measuring signal 382, the processor 36 determines the S-parameters of the device under test 2.

Figure 3:
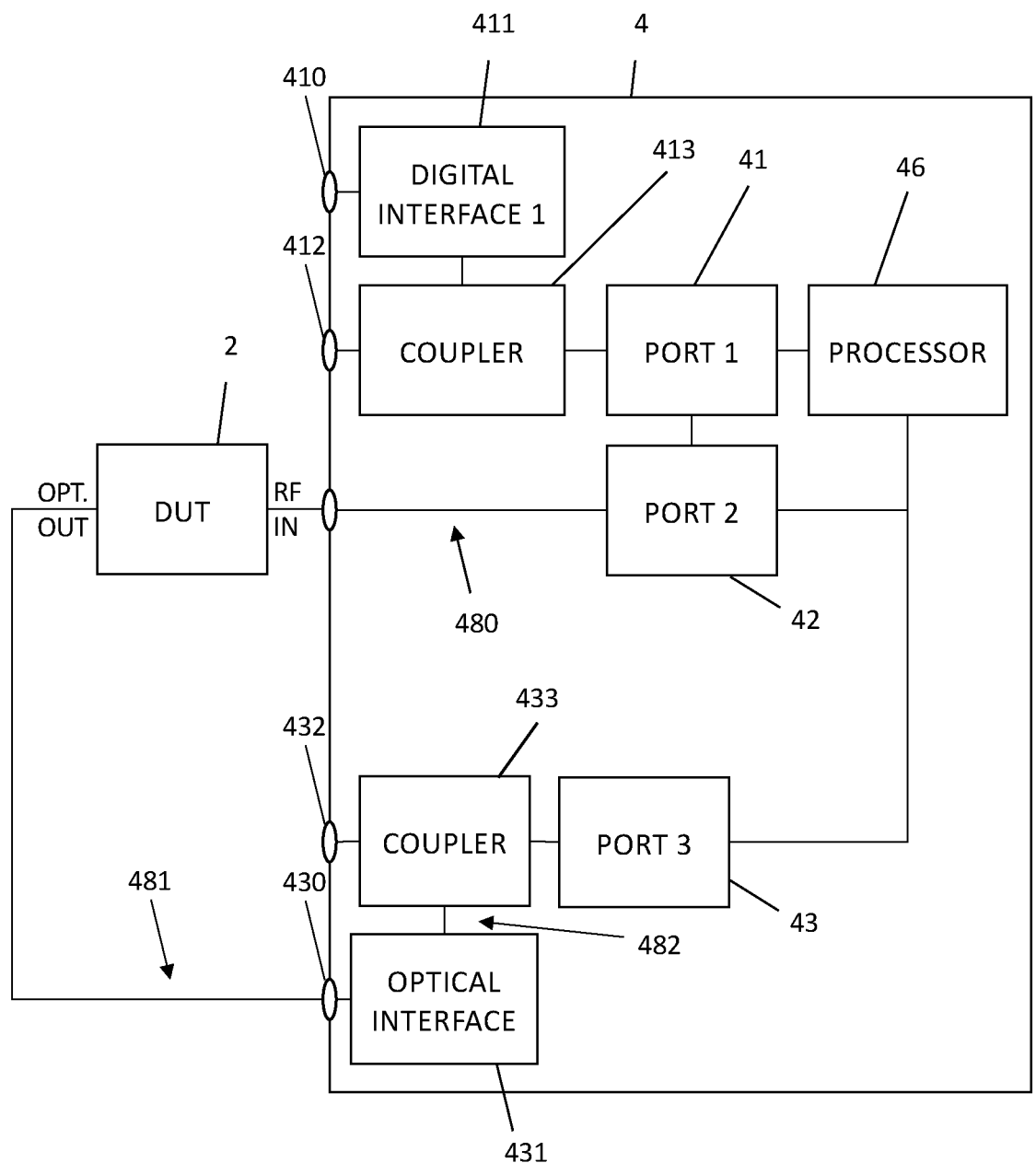
FIG. 3 shows a second embodiment of a vector network analyzer adapted to perform S-parameter measurements on device(s) under test, in accordance with example embodiments of the present invention.

FIG. 3 shows a second embodiment of a vector network analyzer 4 adapted to perform S-parameter measurements on device(s) under test, in accordance with example embodiments of the present invention. Here, the vector network analyzer 4 comprises a first measuring port 41, a second measuring port 42 and a third measuring port 43. The first measuring port 41 is connected to a coupler 413, which in turn is connected to a first measuring port connector 412. The coupler 413 is moreover connected to a first digital interface 411, which again is connected to a first digital interface connector 410. The third measuring port 43 is connected to a coupler 433, which is connected to a second measuring port connector 432 and to a second optical interface 431, which in turn is connected to an optical interface 431, which in turn is connected to a first optical interface connector 430. The coupler 413 couples the digital interface 411 and the connector 412 to the first measuring port 41. The coupler 433 connects the optical interface 431 and the connector 432 to the third measuring port 43.

In the example shown here, the second measuring port 42 generates an analog measuring signal 480 and provides it to a radio frequency input of the device under test 2. The device under test 2 generates an optical measuring signal 481 therefrom and provides it to the optical interface 431 through the optical connector 430. The optical interface 431 converts the signal to an analog measuring signal 482, which is provided by the coupler 433 to the third measuring port 43. The analog measuring signal 482 is measured by the third measuring port 43. The processor 46 determines the S-parameters of the device under test 2 from the analog measuring signals 480 and the analog measuring signal 482.

Figure 4:
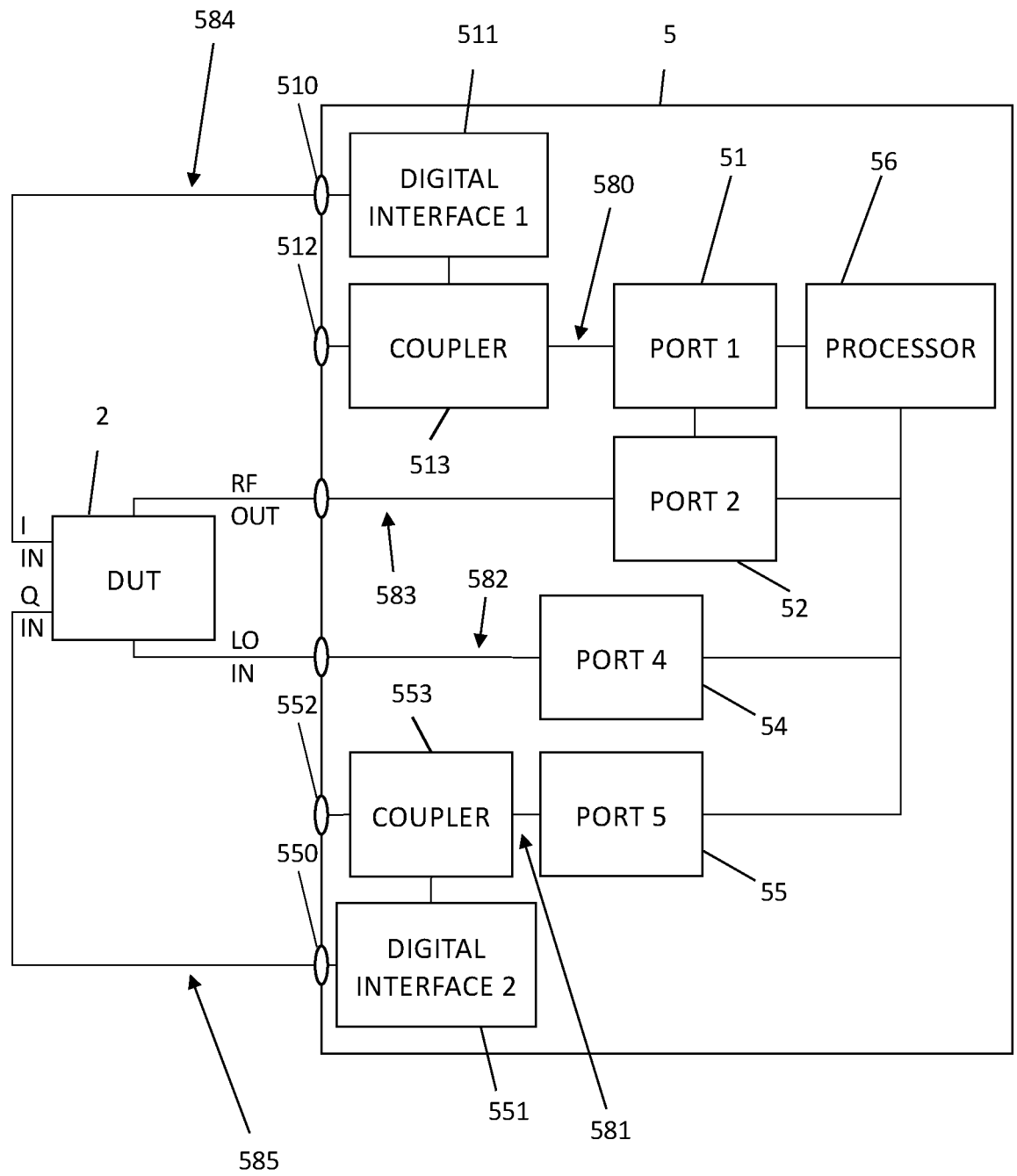
FIG. 4 shows a third embodiment of a vector network analyzer adapted to perform S-parameter measurements on device(s) under test, in accordance with example embodiments of the present invention.

FIG. 4 shows a third embodiment of a vector network analyzer 5 adapted to perform S-parameter measurements on device(s) under test, in accordance with example embodiments of the present invention. In FIG. 4, the vector network analyzer 5 comprises a first measuring port 51, a second port 52, a fourth measuring port 54 and a fifth measuring port 55. The first measuring port 51 is connected to a coupler 513, which is connected to a measuring port connector 512 and to a digital interface 511, which in turn is connected to a digital interface connector 510. The fifth measuring port 55 is connected to a coupler 533, which is connected to a measuring port connector 552 and to a digital interface 551, which in turn is connected to a digital interface connector 550. All measuring ports 51, 52, 54 and 55 are connected to a processor 56.

Here, for a device under test 2 having a digital Inphase (I)-input and a quadrature phase (Q)-input, a local oscillator input and a radio frequency output is measured. The digital interface connector 510 connects the interface 511 to the I-signal input of the device under test 2. The digital interface connector 550 connects the digital interface 551 to the Q-signal input of the device under test 2. The measuring port 54 is connected to a local oscillator input of the device under test 2. The measuring port 52 is connected to the radio frequency output of the device under test 2.

When performing a measurement, the first measuring port 51 generates an analog I-parameter signal S80 and provides it via the coupler 513 to the digital interface 511. The digital interface generates a digital I-parameter signal S84 therefrom and provides it to the device under test 2. The measuring port 55 generates an analog Q-parameter signal S81 and provides it via the coupler 553 to the digital interface 551. The digital interface 551 generates a digital Q-parameter signal S85 therefrom and provides it to the device under test. The measuring port 54 generates a local oscillator signal S82 and provides it to the device undertest. The second measuring port 52 measures a radio frequency output signal S83 of the device under test 2. The processor 56 determines the S-parameters of the device under test 2 from the analog I-parameter signal 580, the analog Q-parameter signal 581, the local oscillator signal 582 and the analog measuring signal 583 measured by the second measuring port 52.

Figure 5:
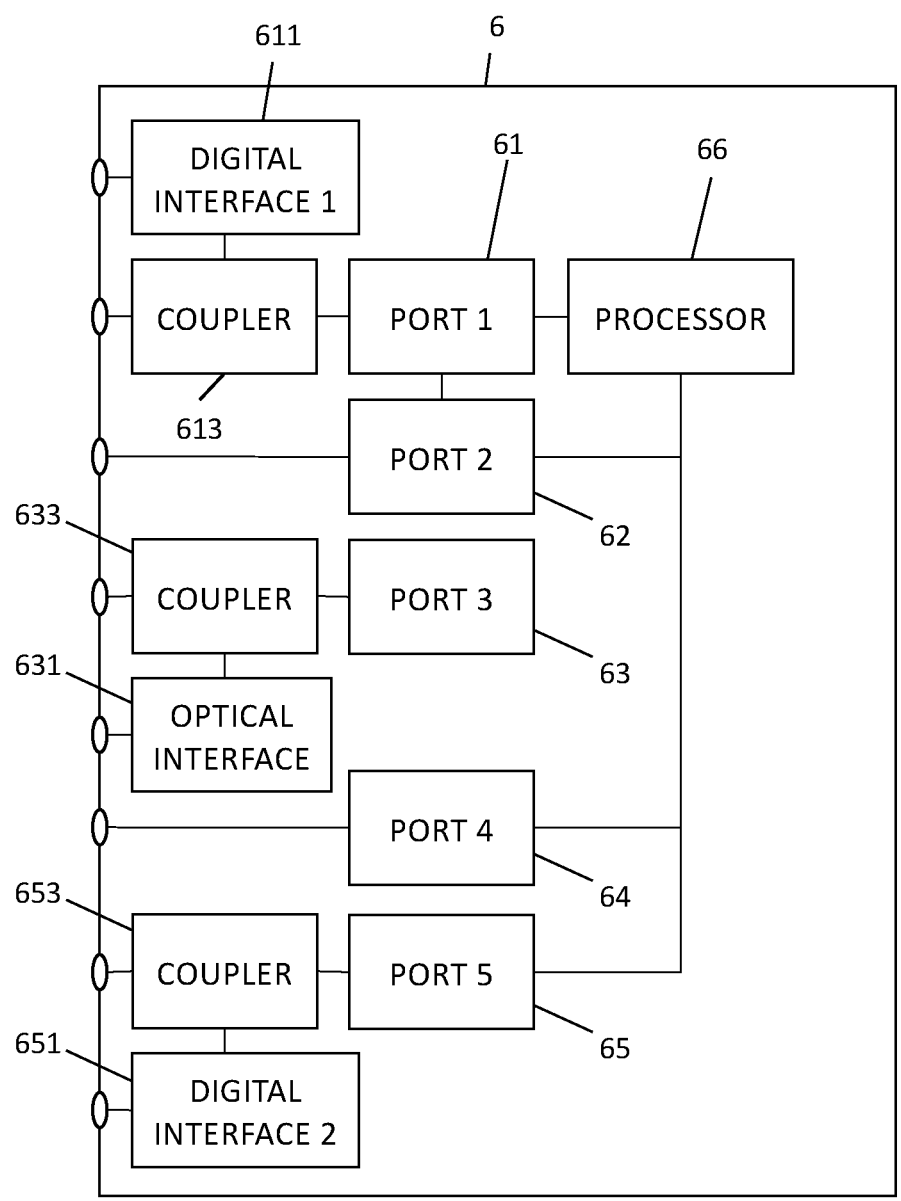
FIG. 5 shows a fourth embodiment of a vector network analyzer adapted to perform S-parameter measurements on device(s) under test, in accordance with example embodiments of the present invention.

FIG. 5 shows a fourth embodiment of a vector network analyzer 6 adapted to perform S-parameter measurements on device(s) under test, in accordance with example embodiments of the present invention. In FIG. 5, the vector network analyzer 6 comprises five measuring ports 61-65, each connected to a joint processor 66. The first measuring port 61 is connected to a coupler 613, which again is connected to a digital interface 611. The third measuring port 63 is connected to a coupler 633, which in turn is connected to an optical interface 631. The fifth measuring port 65 is connected to a coupler 653, which in turn is connected to a digital interface 651.

Here, two digital interfaces, two regular measuring ports and one optical interface are shown. Each of the interfaces is preferably bi-directional. Alternatively, the interfaces can be mono-directional. Also the number of measuring ports and interfaces is not to be understood as limiting. A number of one, two, three, four or more digital and/or optical interfaces can be employed. Also a number of one, two, three, four, five, six, seven, eight, nine, ten or more measuring ports can be used.

With regard to the embodiments of FIG. 2-5, the number of measuring ports need not be limited to the depicted number. Just as well, 6, 7, 8, 9, 10, or more measuring ports can be present within the measuring device according to example embodiments of the present invention. Further, the number of optical interfaces and digital interfaces also need not be limited to the number shown in such embodiments. By way of example, the number of optical and/or digital interfaces may be up to the total number of measuring ports. In further accordance with such example embodiments, calibration of all the measuring ports, optical interfaces and/or digital interfaces is possible.

Figure 6:
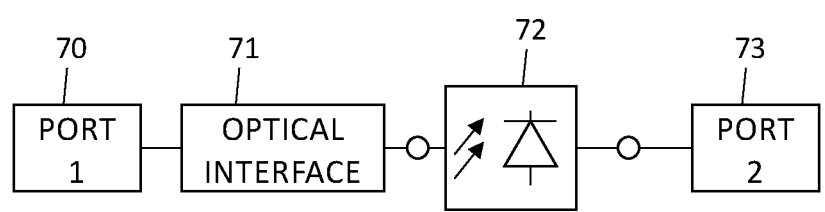
FIG. 6 shows a fifth embodiment of a vector network analyzer adapted to perform S-parameter measurements on device(s) under test, in accordance with example embodiments of the present invention.

FIG. 6 shows a fifth embodiment of a vector network analyzer 7 adapted to perform S-parameter measurements on device(s) under test, in accordance with example embodiments of the present invention. In FIG. 6, the measuring device 7 comprises a first measuring port 70 connected to an optical interface 71 and the second measuring port 73. The remaining components of the measuring device 7 are not displayed in FIG. 6 as they are as shown in FIGS. 2-5.

By way of example, the device under test is a photodiode 72, which is connected to the optical interface 71 on its optical side and to the second measuring port 73 on its electrical side. Since the first measuring port 70 in conjunction with the optical interface 71, as well as the second measuring port 73, are calibrated, it is possible to measure the group delay of the photodiode 72. Also other parameters of the photodiode 72 can be measured with this setup.

By way of further example, in order to perform such a measurement, the measuring port 70 generates a radio frequency signal and sends is to the optical interface 71. The optical interface 71 generates an optical signal therefrom and transmits it to the photodiode 72. This can occur using an optical fiber or through an air gap. The photodiode 72 generates a radio frequency response signal, which is then measured by the measuring port 73.

Figure 7:
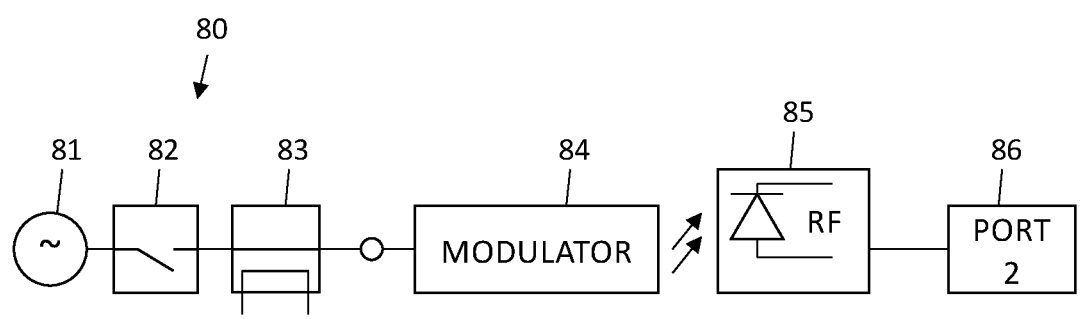
FIG. 7 shows a sixth embodiment of a vector network analyzer adapted to perform S-parameter measurements on device(s) under test, in accordance with example embodiments of the present invention.

FIG. 7 shows a sixth embodiment of a vector network analyzer adapted to perform S-parameter measurements on device(s) under test, in accordance with example embodiments of the present invention. In FIG. 7, the measuring device 8 comprises a measuring port 80, which is comprised of a signal generator 81, connected to a pulse generator 82, which in turn is connected to a coupler 83. The measuring device 8 further comprises an optical interface 85, which is in practice a photodiode, which is connected to a second measuring port 86.

By way of example, when performing a measurement, the signal generator 81 generates a radio frequency signal which is provided to the pulse generator 82. The pulse generator 82 then generates accurately defined pulses of known spacing and timing, based on the radio frequency signal, which are provided to the coupler 83. The coupler diverts a part of the signal for measurement purposes, and sends the remaining signal to the device under test 84 (e.g., an optical modulator, such as a laser diode).

The optical modulator 84 receives the electrical pulse signal and generates an optical output signal based on the electrical pulse signal. The optical signal is provided to the optical interface 85 (e.g., received by the photodiode), and converted to a radio frequency signal, which is provided to the second measuring port 86. The first measuring port 80, the second measuring port 86 and the optical interface 85 may thereby be calibrated with regard to each other, and thus it is possible to measure the group delay of the optical modulator 84, as well as further parameters thereof.

Figure 8:
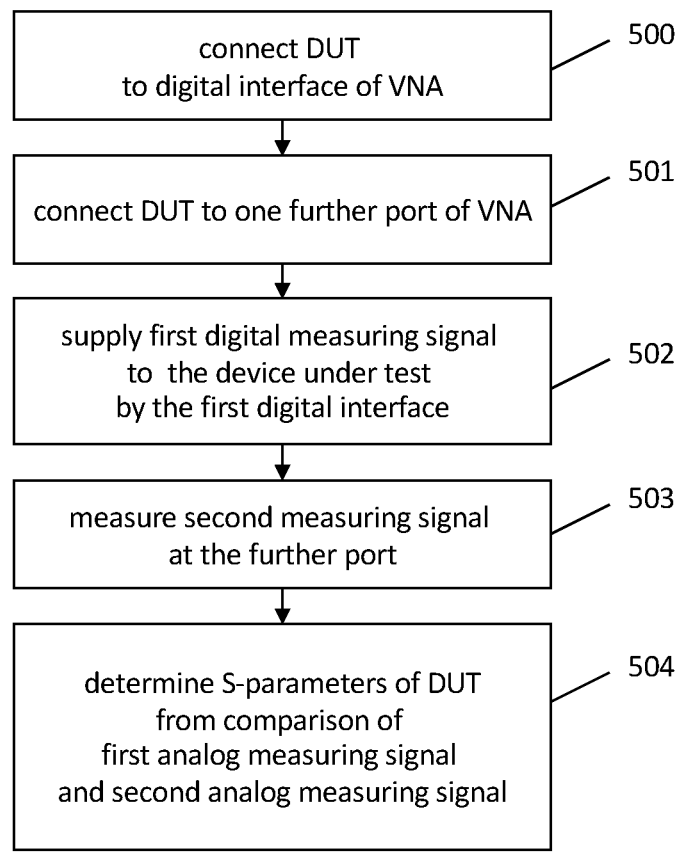
FIG. 8 shows a first embodiment of a method for measuring the scattering parameters of device(s) under test, in accordance with example embodiments of the present invention.

FIG. 8 shows a first embodiment of a method for measuring the scattering parameters of device(s) under test, in accordance with example embodiments of the present invention. In step 500, a device under test is connected to a digital interface of a vector network analyzer. In step 501, the device under test is connected to a further measuring port of the vector network analyzer. In step 502, a first digital measuring signal is supplied to the device under test by the first digital interface. In step 503, a second measuring signal, which is generated by the device under test as a reaction to receiving the first digital measuring signal, is measured at the further measuring port of the vector network analyzer. In step 504, S-parameters of the device under test are determined from the first analog measuring signal and the second analog measuring signal.

Figure 9:
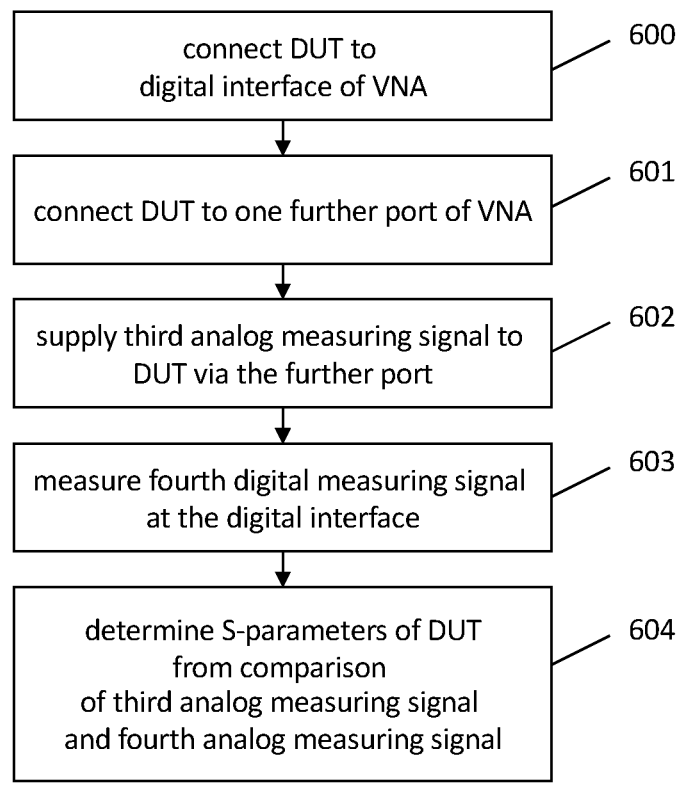
FIG. 9 shows a second embodiment of a method for measuring the scattering parameters of device(s) under test, in accordance with example embodiments of the present invention.

FIG. 9 shows a second embodiment of a method for measuring the scattering parameters of device(s) under test, in accordance with example embodiments of the present invention. In FIG. 9, the reverse measuring direction than in FIG. 8 is shown. In step 600, the device under test is connected to a digital interface of a vector network analyzer. In step 601, the device under test is connected to a further measuring port of the vector network analyzer. In step 602, a third analog measuring signal is supplied to the device under test via the further port. In step 603, a fourth digital measuring signal is measured at the digital interface, and a fourth analog measuring signal is determined therefrom. In step 604, the S-parameters of the device under test are determined from a comparison of the third analog measuring signal and the fourth analog measuring signal.

Figure 10:
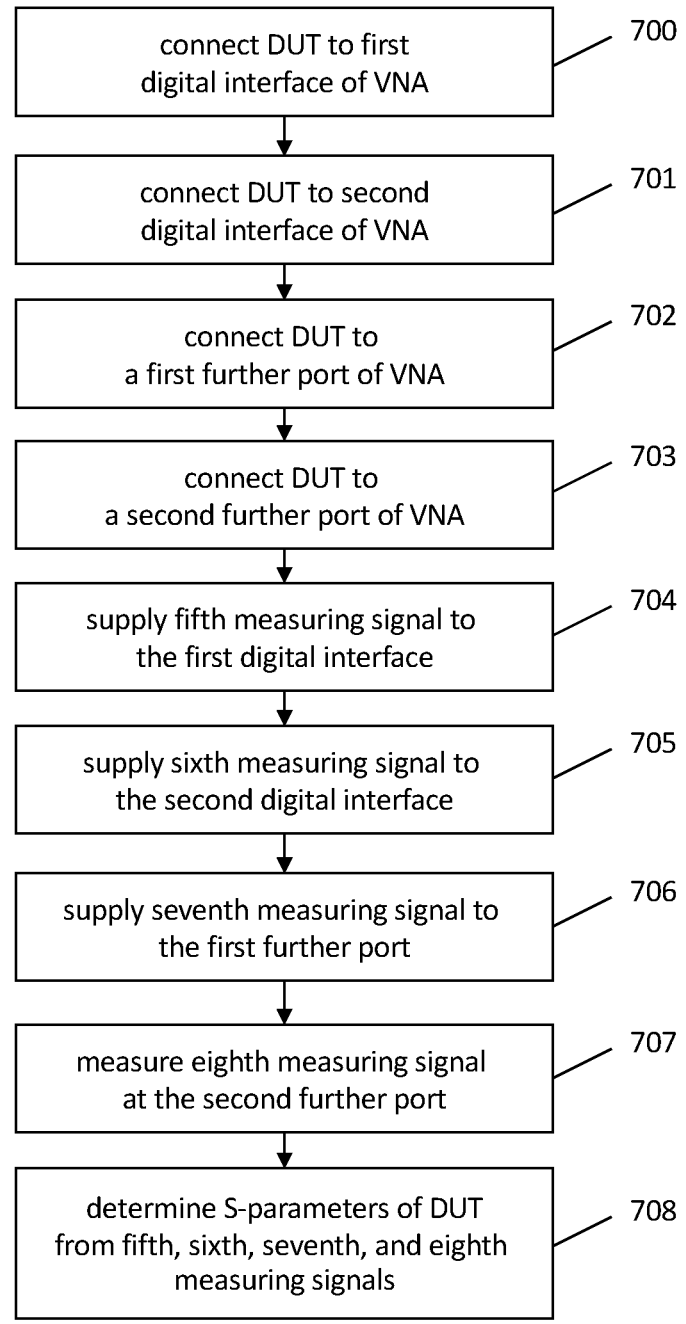
FIG. 10 shows a third embodiment of a method for measuring the scattering parameters of device(s) under test, in accordance with example embodiments of the present invention.

FIG. 10 shows a third embodiment of a method for measuring the scattering parameters of device(s) under test, in accordance with example embodiments of the present invention. In FIG. 10, a measurement of a device under test having two digital input ports, as shown in FIG. 4, is shown. In step 700, a device under test is connected to a first digital interface of the vector network analyzer. In step 701, the device undertest is connected to a second digital interface of the vector network analyzer. In step 702, the device undertest is connected to a first further measuring port of the vector network analyzer. In step 703, the device under test is connected to a second further measuring port of the vector network analyzer. In step 704, a fifth measuring signal is provided to a first digital interface. In step 705, a sixth measuring signal is provided to a second digital interface of the vector network analyzer. In step 706, a seventh analog measuring signal is provided to the first further measuring port of the vector network analyzer. In step 707, an eighth analog measuring signal is measured at the second further measuring port of the vector network analyzer. In step 708, S-parameters of the device under test are determined from the fifth, sixth, seventh and eighth analog measuring signals.

The embodiments of the present invention can be implemented by hardware, software, or any combination thereof. Various embodiments of the present invention may be implemented by one or more application specific integrated circuits (ASICs), digital signal processors (DSPs), digital signal processing devices (DSPDs), programmable logic devices (PLDs), field programmable gate arrays (FPGAs), processors, controllers, microcontrollers, microprocessors, or the like.

Various embodiments of the present invention may also be implemented in the form of software modules, processes, functions, or the like which perform the features or operations described above. Software code can be stored in a memory unit so that it can be executed by a processor. The memory unit may be located inside or outside the processor and can communicate date with the processor through a variety of known means.

The characteristics of the exemplary embodiments can be used in any combination. Although the present invention and its advantages have been described in detail, it should be understood, that various changes, substitutions and alterations can be made herein without departing from the spirit and scope of the invention as defined by the appended claims.

What is claimed is:

1. A measuring device, comprising:
a first measuring port;
a digital interface connected to the first measuring port, wherein the digital interface is adapted to be connected to a digital input or output of a device under test (DUT);
a second measuring port adapted to be connected to a radio frequency (RF) input or output of the DUT; and
a processor adapted to determine scattering parameters (S-parameters) of the DUT based on measuring signals transmitted to the DUT and received from the DUT by the first measuring port and the second measuring port; and
wherein the digital interface is connected to the digital input of the DUT, and the second measuring port is connected to the RF output of the DUT,
wherein the first measuring port is adapted to generate a first analog measuring signal and to provide the first analog measuring signal to the digital interface,
wherein the digital interface is adapted to generate a digital measuring signal based on the first analog measuring signal, and to provide the digital measuring signal to the digital input of the DUT,
wherein the second measuring port is adapted to receive a second analog measuring signal generated by the DUT based on the digital measuring signal and output by the RF output of the DUT, and
wherein the processor is adapted to determine the S-parameters of the DUT based on the first analog measuring signal and the second analog measuring signal.

2. The measuring device according to claim 1, wherein the measuring device is a vector network analyzer.

3. The measuring device according to claim 1, further comprising:
a first measuring port connector adapted to connect the RF input or output of the DUT to the first measuring port; and
a digital interface connector adapted to connect the digital input or output of the DUT to the digital interface.

4. The measuring device according to claim 3, further comprising:
a first coupler adapted to connect the first measuring port to the first measuring port connector and to the digital interface.

5. The measuring device according to claim 4, wherein the first coupler provides for selectively connecting the first measuring port to the first digital interface or to the first measuring port.

6. The measuring device according to claim 4, further comprising:
a third measuring port;
an optical interface;
a second measuring port connector adapted to connect the RF input or output of the DUT to the third measuring port;
a first optical interface connector adapted to connect an optical input or output of the DUT to the optical interface; and a second coupler adapted to connect the third measuring port to the second measuring port connector and to the first optical interface connector.

7. The measuring device according to claim 6, wherein the second coupler provides for selectively connecting the third measuring port to the optical interface or to the second measuring port.

8. The measuring device according to claim 6, wherein the measuring device is a vector network analyzer.

9. The measuring device according to claim 1, further comprising:
- a digital interface connector connected to the digital interface, and adapted to connect the digital interface to the digital input or output of the DUT;
- a first measuring port connector connected to the first measuring port; and
- a second measuring port connector connected to the second measuring port, and adapted to connect the second measuring port to the RF input or output of the DUT.

10. The measuring device according to claim 1, further comprising:
- a first coupler adapted to connect the digital interface to the first measuring port.

11. The measuring device according to claim 10, further comprising:
- a third measuring port;
- an optical interface; and
- a second coupler adapted to connect the optical interface to the third measuring port.

12. The measuring device according to claim 11, further comprising:
- a digital interface connector connected to the digital interface;
- a first measuring port connector connected to the first coupler;
- a second measuring port connector connected to the second measuring port, and adapted to connect the second measuring port to the RF input or output of the DUT;
- a third measuring port connector connected to the second coupler; and
- an optical interface connector connected to the optical interface, and adapted to connect the optical interface to the optical input or output of the DUT.

13. A method for measuring scattering parameters (S-parameters) of a device under test (DUT), comprising:
- generating, by a first measuring port of a measuring device, a first analog measuring signal, and providing the first analog measuring signal to a digital interface of the measuring device;
- generating, by the digital interface of the measuring device, a digital measuring signal based on the first analog measuring signal, and providing the digital measuring signal to a digital input of the DUT;
- receiving, by a second measuring port of the measuring device, a second analog measuring signal generated by the DUT based on the digital measuring signal and output by an RF output of the DUT; and
- determining, by a processor of the measuring device, the S-parameters of the DUT based on the first analog measuring signal and the second analog measuring signal.

14. A method for measuring scattering parameters (S-parameters) of a device under test (DUT), comprising:
- generating, by a first measuring port of a measuring device, a first analog measuring signal, and providing the first analog measuring signal to an optical interface of the measuring device via a coupler;
- generating, by the optical interface of the measuring device, an optical measuring signal based on the first analog measuring signal, and providing the optical measuring signal to an optical input of the DUT;
- receiving, by a second measuring port of the measuring device, a second analog measuring signal generated by the DUT based on the optical measuring signal and output by a radio frequency output of the DUT;
- determining, by a processor of the measuring device, the S-parameters of the DUT based on the first analog measuring signal and the second analog measuring signal.

* * * * *